United States Patent [19]

Miyazaki

[11] Patent Number: 5,595,938
[45] Date of Patent: Jan. 21, 1997

[54] METHOD OF MANUFACTURING SEMICONDUCTOR DEVICE

[75] Inventor: Junji Miyazaki, Hyogo, Japan

[73] Assignee: Mitsubishi Denki Kabushiki Kaisha, Tokyo, Japan

[21] Appl. No.: 345,734

[22] Filed: Nov. 22, 1994

[30] Foreign Application Priority Data

Dec. 28, 1993 [JP] Japan ..................................... 5-337105

[51] Int. Cl.$^6$ ............................................. H01L 21/469
[52] U.S. Cl. .......................... 437/195; 437/189; 437/192; 437/246; 430/311; 430/313
[58] Field of Search ..................................... 437/195, 189, 437/200, 229, 245, 246; 430/311, 313

[56] References Cited

U.S. PATENT DOCUMENTS

| | | | |
|---|---|---|---|
| 4,557,797 | 12/1985 | Fuller et al. | 437/16 |
| 4,717,625 | 1/1988 | Watakabe et al. | 148/DIG. 147 |
| 4,957,834 | 9/1990 | Matsuda et al. | 430/5 |
| 5,066,615 | 11/1991 | Brady et al. | 437/729 |
| 5,106,786 | 4/1992 | Brady et al. | 437/229 |
| 5,266,424 | 11/1993 | Fujino et al. | 430/5 |

FOREIGN PATENT DOCUMENTS

| | | |
|---|---|---|
| 62-52551 | 3/1987 | Japan . |
| 63-202748 | 8/1988 | Japan . |
| 0170701 | 3/1989 | Japan . |
| 3-73528 | 3/1991 | Japan . |
| 4-34436 | 2/1992 | Japan . |
| 4-233719 | 8/1992 | Japan . |
| 4-246649 | 9/1992 | Japan . |
| 5-299338 | 11/1993 | Japan . |
| 5-341385 | 12/1993 | Japan . |
| 6-232273 | 8/1994 | Japan . |

OTHER PUBLICATIONS

J. Vac. Sci, Technol. B 10(6), Nov./Dec. 1992, pp. 2480 to 2485, "Antireflective Mosi Photomasks", Akira Chiba et al.

Pampalone et al, "Improved Photoresist Patterning over Reflective Topographies Using Titanium Oxynitride Antireflection Coatings", J. Electrochem. Soc., vol. 136, No. 4, Apr. 1989, pp. 1181–1185.

"Antireflection Layers and Planarization for Microlithography", Mark W. Horn, Solid State Technology, Nov. 1991, pp. 57–62.

"Optical Absorption as a Control Test for Plasma Silicon Nitride Deposition", Myron J. Rand et al., Solid–State Science and Technology, pp. 99–101, Jan. 1978.

Primary Examiner—Charles L. Bowers, Jr.
Assistant Examiner—Michael Trinh
Attorney, Agent, or Firm—Lowe, Price, LeBlanc & Becker

[57] ABSTRACT

A method of manufacturing a semiconductor device includes the steps of forming an interconnection layer consisting of a metal material on a substrate, and forming an anti-reflection film including a compound having metal-silicon-oxygen on this interconnection layer using the same metal material as the material used for this interconnection layer. Thus, it is made possible to form interconnection layer and anti-reflection film by the same apparatus and it is also made possible to treat interconnection layer and anti-reflection film with the same etchant. As a result, efficiency in the method of manufacturing the semiconductor device including an anti-reflection film can be improved.

1 Claim, 9 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly to a method of manufacturing a semiconductor device in which an anti-reflection film is employed.

2. Description of the Background Art

Conventionally, in a manufacturing process of a semiconductor device, an interconnection layer is formed on a substrate, and on that interconnection layer a resist film is formed. Using a predetermined light source for exposure, an exposure of a predetermined pattern is then effected on the resist film. Thereafter, development is performed to form the resist film having the predetermined pattern. Furthermore, the step of etching the interconnection layer on the substrate is employed, using this resist film as a mask.

However, when the exposure of the predetermined pattern is effected on the resist film, the shape of the pattern formed by the exposure of the resist film would be deformed from a desired shape if there is a difference in level at the underlying interconnection layer or the like, since the exposure light is reflected at the sloped portion caused by this difference in level at the interconnection layer underneath the resist film and is scattered within the resist film.

Figure 17:
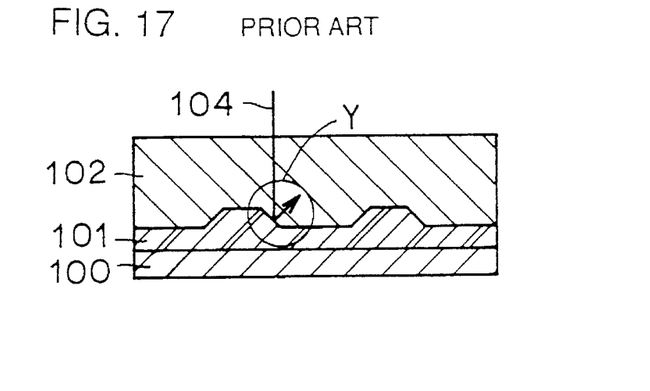
FIGS. 17 and 18 are cross sectional views illustrating first and second steps of manufacturing a semiconductor device of a first conventional example.

Referring first to FIG. 17, an interconnection layer 101 is formed on a substrate 100. On this interconnection layer 101, a resist film 102 is formed. When an exposure light 104 is directed to this resist film 102, a portion of the resist film 102 which is not intended to be exposed is subjected to exposure at a sloped portion (a region denoted in the figure by the circle Y) caused by the difference in level provided at the interconnection layer 101.

Figure 18:
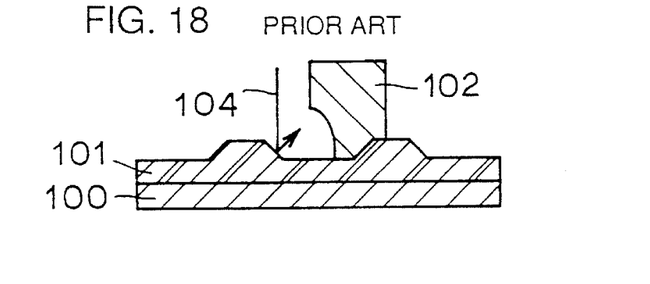

Referring to FIG. 18, if development is then effected on this resist film 102, the resist film is not formed to have a desired shape, meaning that the interconnection layer 101 cannot be etched to obtain a predetermined shape using this resist film. One way to solve this problem is to form an anti-reflection film underneath the resist film for preventing the scattering of the exposure light at the sloped portion caused by the difference in level at the interconnection layer.

Figure 19:
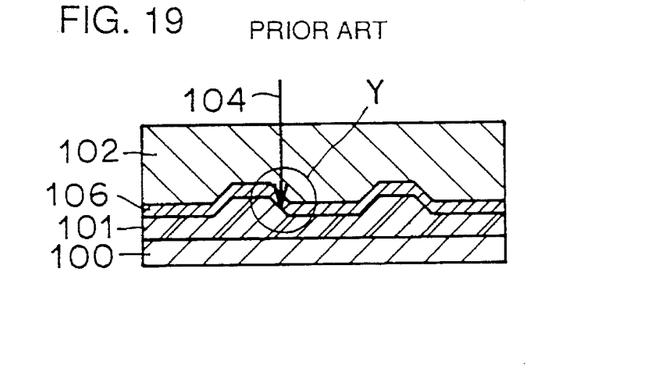
FIGS. 19 and 20 are cross sectional views illustrating first and second steps of manufacturing a semiconductor device of a second conventional example.

Referring to FIG. 19, an interconnection layer 101 is formed on a substrate 100. On this interconnection layer 101 is formed an anti-reflection film 106 of an organic material which absorbs exposure light 104. A resist film 102 is formed on this anti-reflection film 106.

With this anti-reflection film 106 formed, exposure light 104 does not scatter as seen in FIG. 19 even when exposure light 104 is incident on the region of sloped portion Y caused by the difference in level, and thus it is possible to expose resist film 102 in a predetermined pattern. Thereafter, referring to FIG. 20, resist film 102 is subjected to development so that resist film 102 having a predetermined pattern can be obtained.

Figure 20:
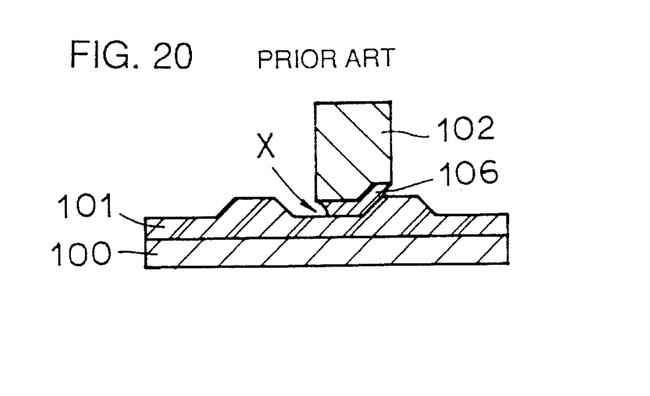

However, even in the above-described method in which anti-reflection film 106 is formed, when etching of resist film 102 is performed, anti-reflection film 106 is also etched away as shown in FIG. 20 which causes the formation of an undercut portion X, since resist film 102 and anti-reflection film 106 are both formed from organic type material. The formation of this undercut portion leads to peeling of the resist film as the pattern of the semiconductor device becomes smaller.

Also, there is a method of using an amorphous silicon consisting of an inorganic type material instead of this anti-reflection film 106 made of organic type material. However, although this anti-reflection film of amorphous silicon can reduce the scattering of the exposure light when a g-line having an exposure wavelength of 436 nm is employed, it cannot reduce the scattering of the exposure light sufficiently when i-line having a wavelength of 365 nm or a krF excimer laser light having a wavelength of 248 nm is used as the exposure light.

Thus, a method of manufacturing a semiconductor device employing a compound of metal-silicon-nitride as this anti-reflection film is disclosed in Japanese Patent Laying-Open No. 4-233719. FIGS. 21 to 24 are cross sectional views showing the steps of manufacturing the semiconductor device when a film consisting of the compound of metal-silicon-nitride is employed as the above-described anti-reflection film.

Figure 21:
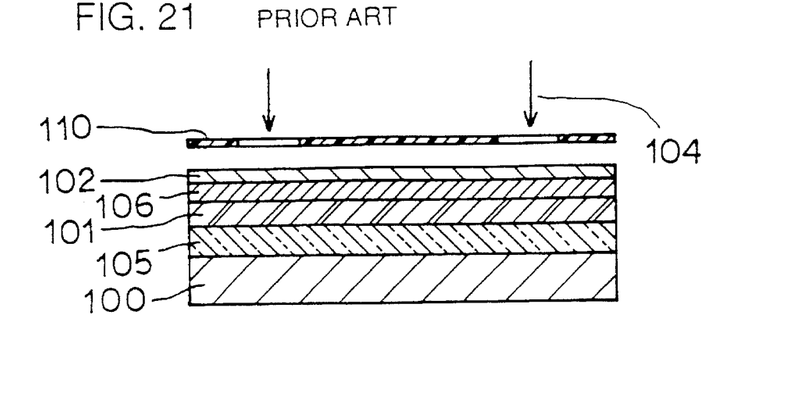
FIGS. 21 to 24 are cross sectional views illustrating first to fourth steps of manufacturing a semiconductor device of a third conventional example.

Referring first to FIG. 21, a dielectric layer 105 of silicon oxynitride is formed on a semiconductor substrate 100. A metal layer 101 of aluminum is formed on this dielectric layer 105 to provide a conductor pattern. On this metal layer 101, an anti-reflection film 106 including a compound of metal-silicon-nitride is formed. Metals such as titanium, vanadium, chromium, zirconium, niobium, molybdenum, hafnium, tantalum, or tungsten may be used for the metal included in this anti-reflection film 106. A resist film 102 is formed on this anti-reflection film 106. Furthermore, a photomask 110 of a predetermined pattern is disposed above this resist film 102. Thereafter, by using this photomask 110, resist film 102 is irradiated with exposure light 104, thus a predetermined pattern is obtained.

Figure 22:
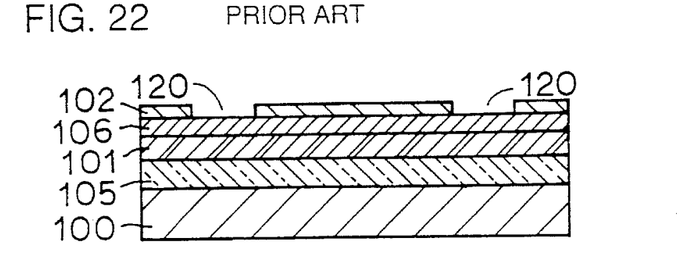
Figure 23:
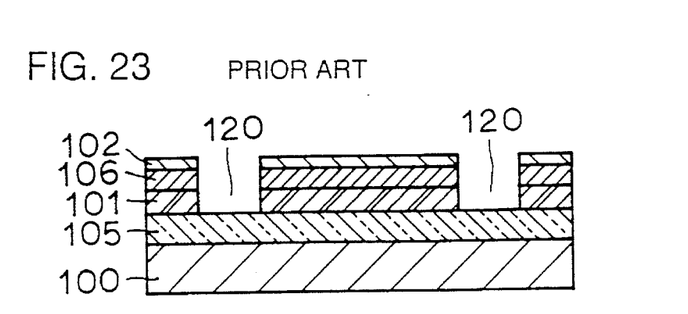
Figure 24:
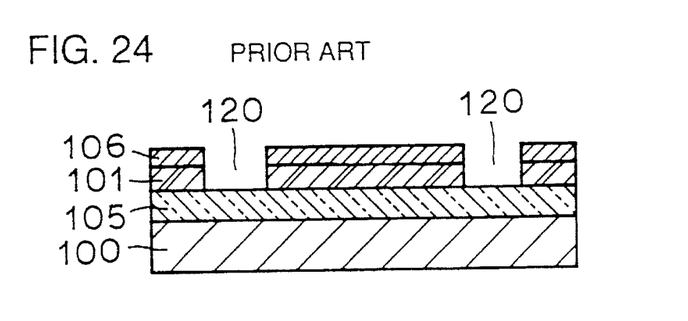

Referring next to FIG. 22, resist film 102 is developed to form an opening 120 having a predetermined pattern. Then, referring to FIG. 23, anti-reflection film 106 and metal layer 101 are etched, using resist film 102 as a mask. Referring to FIG. 24, resist film 102 is then removed by a predetermined process thereby enabling the formation of metal layer 101 having a pattern of predetermined shape.

However, in the above-described prior art, metal layer 101 is formed of aluminum and the metal used for the anti-reflection film consisting of metal-silicon-nitride film may be titanium, vanadium, chromium, zirconium, niobium, molybdenum, hafnium, tantalum, tungsten, or the like. Accordingly, although the metal layer and the anti-reflection film can be formed by the use of the same apparatus, the target had to be altered.

Accordingly, the number of the steps for manufacturing the semiconductor device is increased which hampers the improvement in the productivity of the semiconductor device and hampers cost reduction. In addition, the wavelength of the exposure light will become shorter when the semiconductor device comes to be integrated to a higher degree, thus further requiring an anti-reflection film which can prevent the scattering of the exposure light.

SUMMARY OF THE INVENTION

It is an object of the present invention to improve efficiency in a method of manufacturing a semiconductor device including steps of manufacturing an anti-reflection film.

In order to attain the above object, the method of manufacturing the semiconductor device includes the following steps.

First, an interconnection layer made of a metal material is formed on a substrate. Then, an anti-reflection film including a compound having metal-silicon-oxygen is formed on this interconnection layer, using the same metal material as that of this interconnection layer.

Thereafter, a resist film having a pattern of a predetermined shape is formed on this anti-reflection film by photolithography. Then, patterning of the interconnection layer and the anti-reflection film is performed in accordance with the pattern of this resist film.

More preferably, the anti-reflection film is formed from a compound which additionally contains nitrogen, that is, a compound having metal-silicon-oxygen-nitrogen.

Yet more preferably, the metal material is selected from the group consisting of molybdenum, tungsten, titanium, aluminum and copper.

In the method of manufacturing the semiconductor device in accordance with the present invention, the anti-reflection film can be formed with an apparatus used for forming the interconnection layer without changing its target. As a result, the semiconductor device can be manufactured efficiently. Also, since the anti-reflection film and the underlying interconnection layer are of material of the same type, the interconnection layer and the anti-reflection film can be patterned by the same etching step with the same etchant.

In addition, even when the wavelength of exposure light is made shorter, it is possible to form a resist film having a predetermined pattern by using an anti-reflection film including a compound of metal-silicon-oxygen which has a sufficient refractive index to prevent the scattering of the exposure light. Also, when patterning a resist film of an organic type material by the step of etching, the anti-reflection film is not etched away by the etchant so that no undercut portion as in the conventional example is produced. Therefore, highly precise patterning of the interconnection film without any peeling of the resist film is possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment in accordance with the present invention will be described in the following with reference to the figures. FIGS. 1 to 5 are cross sectional views showing the manufacturing steps for the semiconductor device of the first embodiment.

Figure 1:
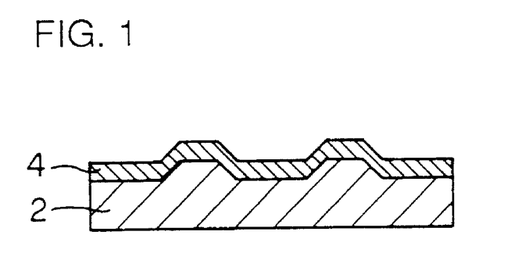
FIGS. 1 to 5 are cross sectional views illustrating first to fifth steps of manufacturing a semiconductor device of a first embodiment according to the present invention.

Referring first to FIG. 1, an interconnection layer 4 is formed, by forming an MoSi, for example, to a thickness of 2000 Å A on a substrate 2 which has a difference in level. Then, referring to FIG. 2, an anti-reflection film 6 is formed by forming an MoSiO film to a thickness of 50 to 1000 Å on this interconnection layer 4.

Figure 2:
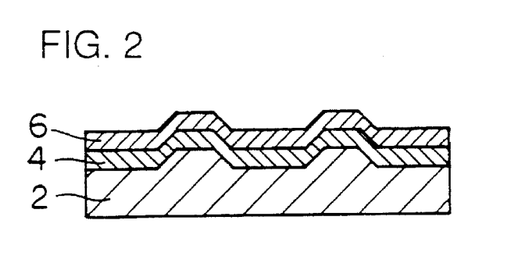

This anti-reflection film 6 may be formed by sputtering, CVD (Chemical Vapor Deposition), or vapor deposition. When sputtering is used, for example, anti-reflection film 6 can be formed by sputtering of MoSi with $Ar+O_2$. By setting the proportion of Ar and $O_2$ so that there would be 50 to 95% of Ar and 5 to 50% of $O_2$ at this time, the complex refractive index of the anti-reflection film 6 can be controlled to an appropriate value.

Figure 6:
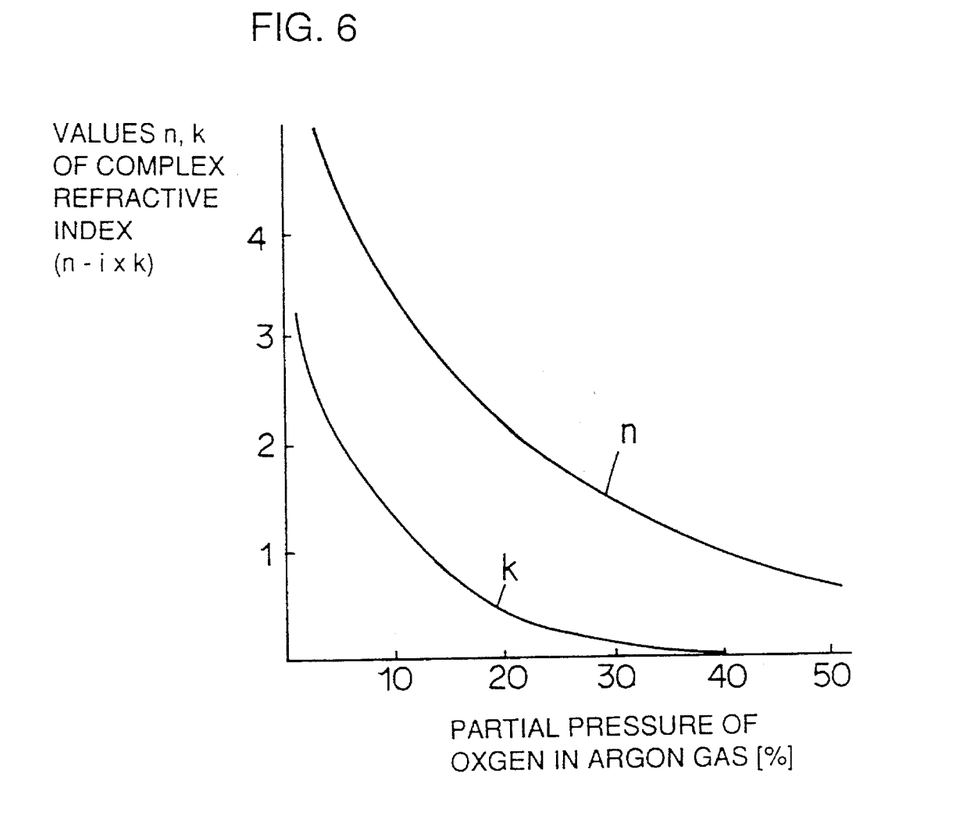
FIG. 6 is a graph showing the relationship between a partial pressure of oxygen in argon gas and a complex refractive index.
Figure 7:
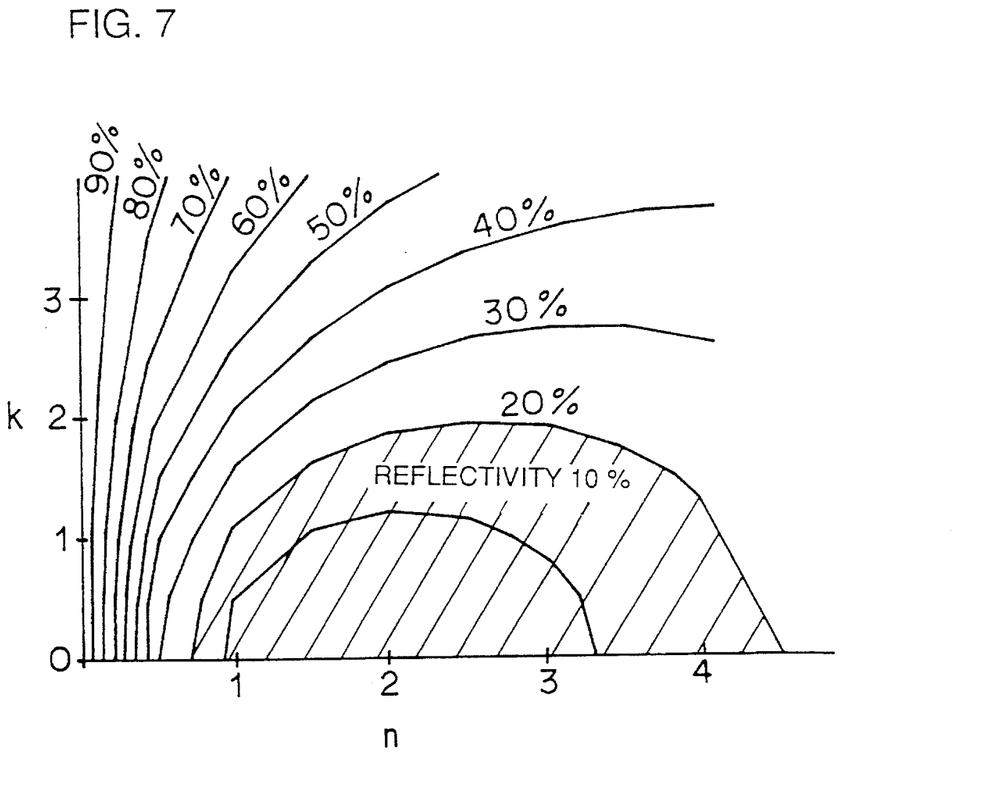
FIG. 7 is a graph showing the reflectivity and the complex refractive index in the first embodiment.
Figure 8:
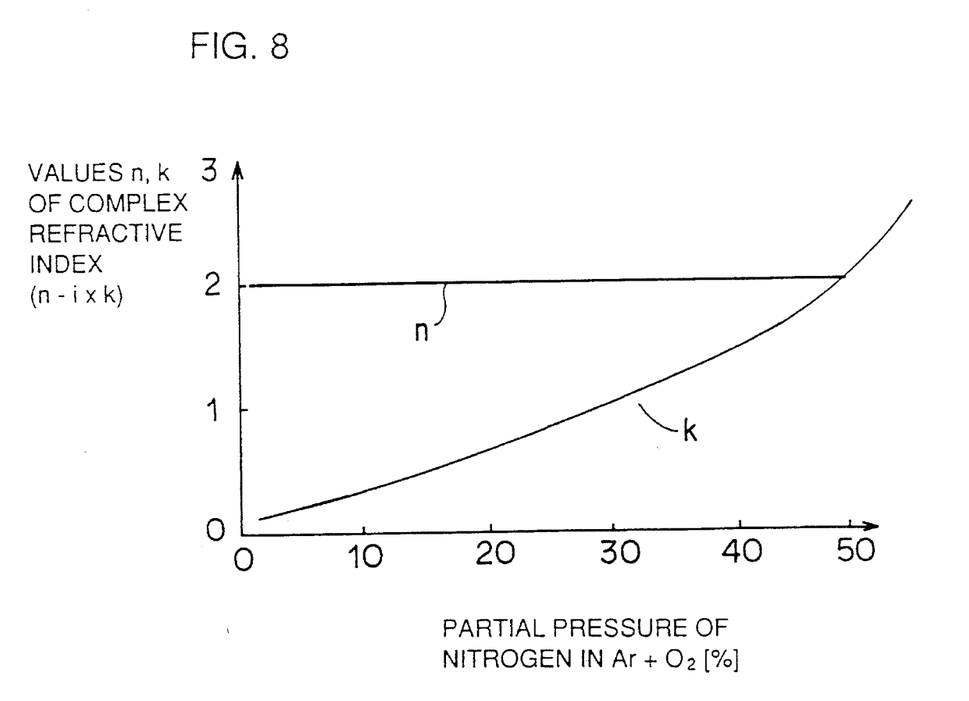
FIG. 8 is a graph showing the relationship between a partial pressure of nitrogen in mixed gas of argon and oxygen and a complex refractive index in the first embodiment.

FIG. 6 is a graph showing the relationship between the partial pressure of oxygen in argon gas and the values n, k of the complex refractive index $(n-i\times k)$ for anti-reflection film 6. From this graph, it can be seen that by setting the partial pressure of oxygen in argon gas at 5 to 50%, the range of values n, k of complex refractive index $(n-i\times k)$ for anti-reflection film 6 can be set such that n=0.8 to 4.5 and k=0 to 2.0.

Values n, k of complex refractive index $(n-i\times k)$ are set to n=0.8 to 4.5 and k=0 to 2 because the reflectivity at the interface between the resist film and the anti-reflection film depends on the complex refractive index $(n-i\times k)$. If n=0.8 to 4.5 and k=0 to 2, it is possible to suppress the reflectivity of anti-reflection film 6 to 20% or lower. Furthermore, by adding about 0 to about 50% of $N_2$ into the sputter gas, it is possible to alter independently the value of k only so that anti-reflection film 6 with optimal values n, k can be formed.

Figure 3:
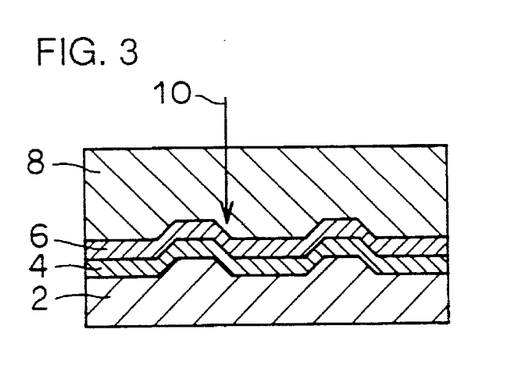
Figure 4:
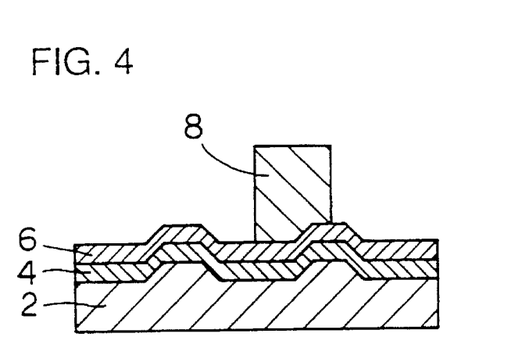

Referring next to FIG. 3, a resist film 8 is formed on anti-reflection film 6 by spin coating. Thereafter, referring to FIG. 4, an exposure light is directed onto a predetermined portion of the resist film. Then, by development, resist film 8 having the predetermined pattern is formed. At this time, the exposure light is not scattered since the above-described anti-reflection film 6 is provided. Therefore, the resist film of a predetermined shape can be formed.

Figure 5:
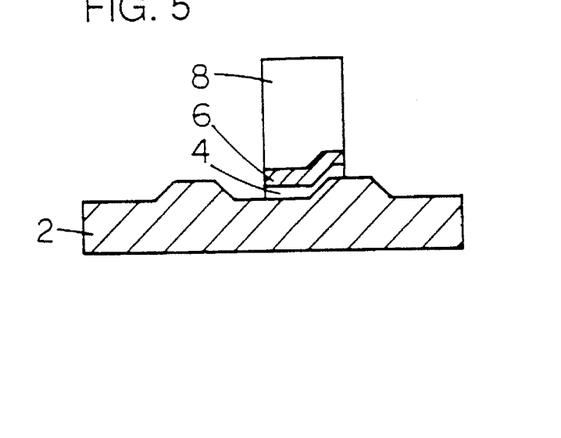

Referring next to FIG. 5, anti-reflection film 6 and interconnection layer 4 are patterned, using resist film 8. For this patterning, dry etching is employed. This dry etching makes it possible to etch anti-reflection film 6 made of MoSiO film and interconnection layer 4 made of MoSi film simultaneously by $Cl_2+BCl_3$ gas or the like. Resist film 8 is then removed by ashing.

Although it is not necessary to remove anti-reflection film 6 which is left on interconnection layer 4 since the metal forming it is of the same type as the metal forming the interconnection layer 4, it may also be removed by dry etching or the like. Based on the foregoing, it is made possible to form interconnection film 4 and anti-reflection film 6 with the same apparatus without changing the target, by forming interconnection layer 4 and anti-reflection film 6 to include metals of the same type. In addition, in the step of patterning interconnection layer 4 and anti-reflection film 6, the patterning can be performed by using the same etchant.

Although Mo is used as the metal material for the interconnection layer and the anti-reflection film in the above-described first embodiment, it is not intended to be limitative. For example, a material selected from the group consisting of W, Ti, Al, and Cu can also be used to obtain the same effect. Further, the same effect can be obtained also by forming resist film 8 on anti-reflection film 6 after the $SiO_2$ film is formed by CVD.

A second embodiment in accordance with the present invention will now be described with reference to the figures. FIGS. 9 to 15 are cross sectional views illustrating the steps of manufacturing a semiconductor device according to the second embodiment.

Figure 9:
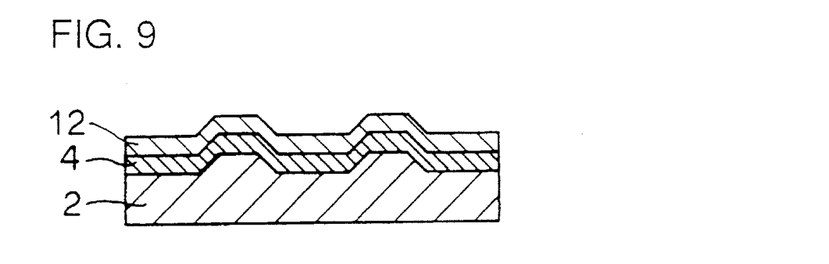
FIGS. 9 to 15 are cross sectional views illustrating first to seventh steps of manufacturing a semiconductor device of a second embodiment according to the present invention.
Figure 10:
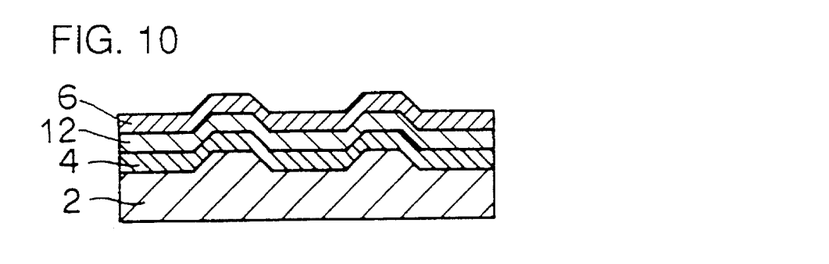

Referring first to FIG. 9, an interconnection layer 4 is formed on a substrate 2 by depositing 2000 Å of WSi. Then, an $SiO_2$ film is deposited on this interconnection layer 4 to a thickness of about 1000 Å by CVD thereby forming an insulating layer 12. Referring to FIG. 10, an anti-reflection film 6 is then formed on insulating film 12 by depositing WSiO film having a thickness of about 50 to about 1000 Å by sputtering, in a manner similar to the first embodiment.

Figure 11:
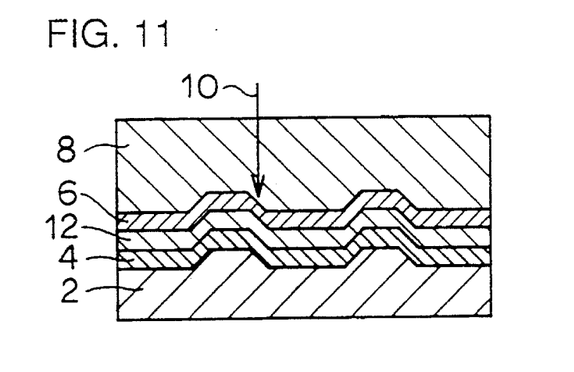
Figure 12:
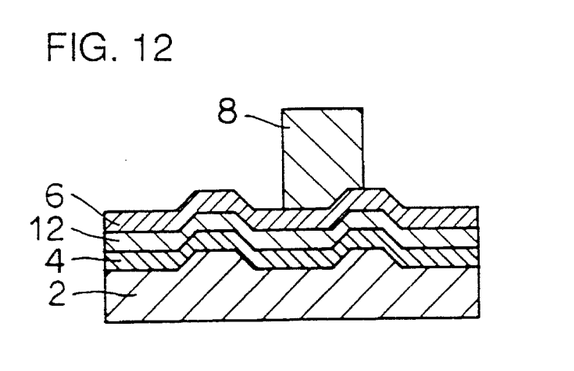

Referring next to FIG. 11, a resist film 8 is formed on anti-reflection film 6 by spin coating. Exposure light is directed onto this resist film, by photolithography. Referring to FIG. 12, development of the resist film is then performed, thereby forming a predetermined resist pattern. At this time, even when there is a slope caused by a difference in level at substrate 2, anti-reflection film 6 prevents the scattering of the exposure light so that it is possible to pattern resist film 8 to a predetermined shape.

Figure 13:
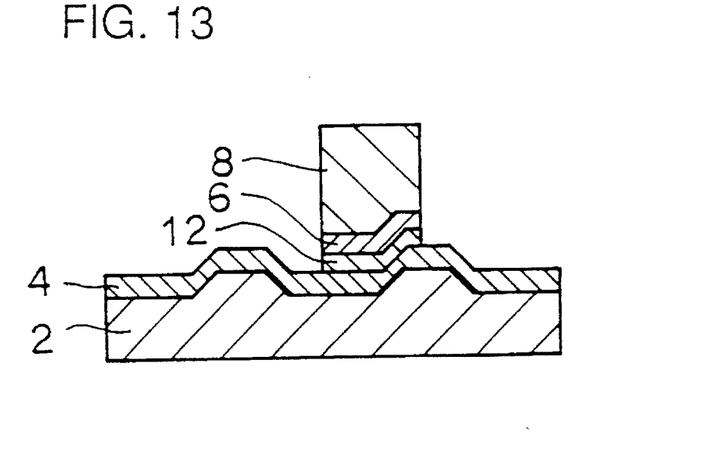

Referring next to FIG. 13, anti-reflection film 6 is subjected to dry etching, using resist film 8 as a mask. Upon this etching, $Cl_2+BCl_3$ gas or the like is used as etching gas. Further, using resist film 8 and anti-reflection film 6 as a mask, insulating layer 12 is etched. Etching gas for this etching is $CHF_3+O_2$.

Figure 14:
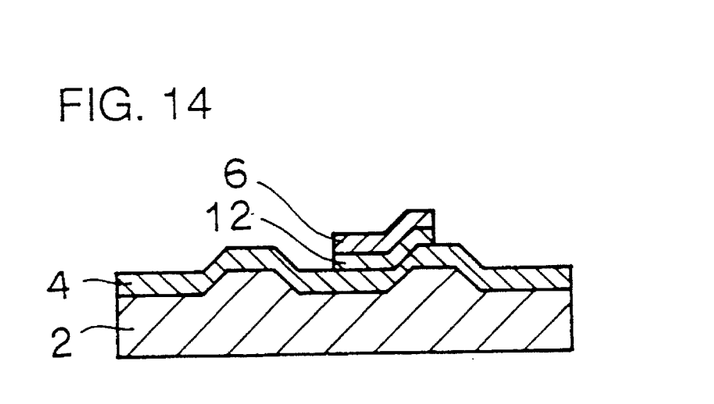
Figure 15:
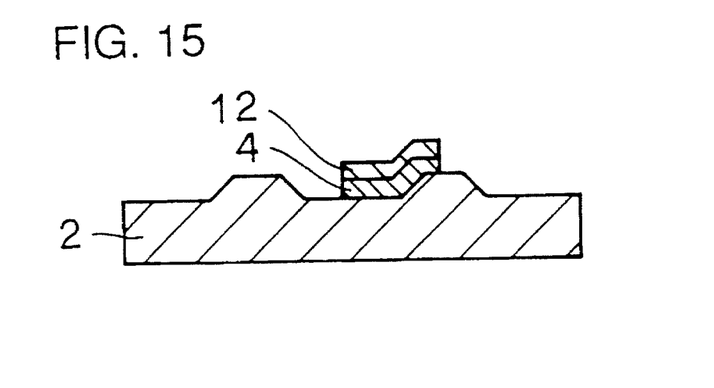

Referring next to FIG. 14, resist film 8 is then removed by ashing. Thereafter, referring to FIG. 15, insulating film 12 is used as a mask for etching interconnection layer 4 so that it would have a predetermined pattern, with the same etchant as the etchant used for anti-reflection film 6, i.e., $Cl_2+BCl_3$. Since anti-reflection film 6 mentioned above is removed simultaneously at this time by etching gas $Cl_2+BCl_3$, it is not necessary to provide the step for removing anti-reflection film 6 in particular.

Based on the foregoing, interconnection layer 4 and anti-reflection film 6 can be formed by the same apparatus and with the same target in this second embodiment also. In addition, patterning of interconnection layer 4 can be performed by using the same etching gas. Further, when patterning interconnection layer 4, it is possible to remove the anti-reflection film at the same time.

Figure 16:
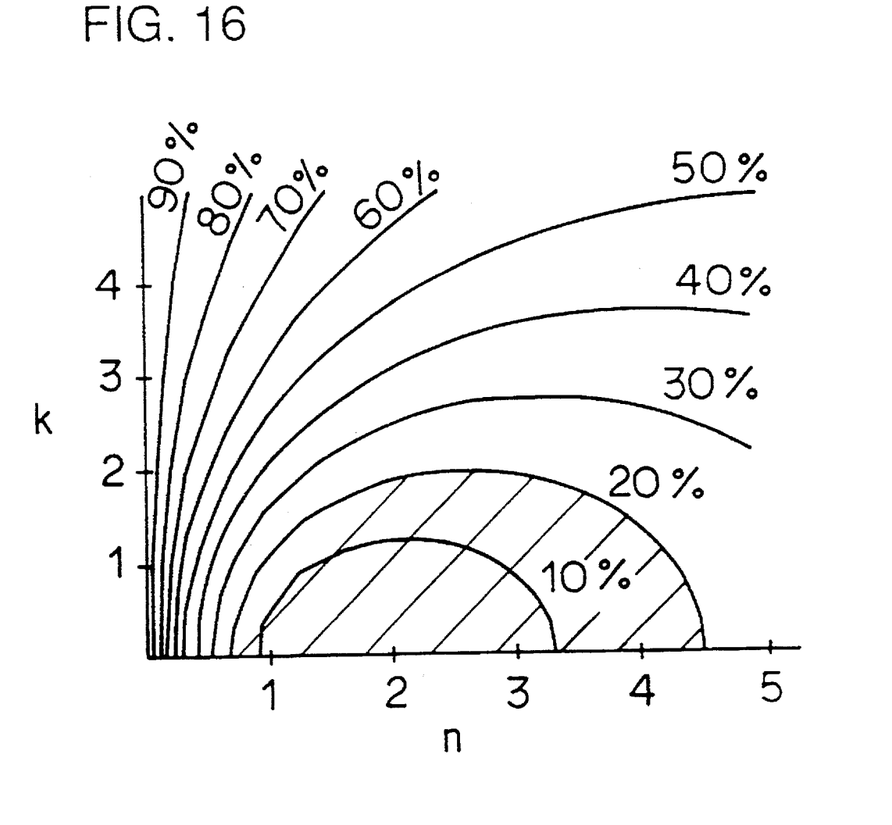
FIG. 16 is a graph showing the relationship between the reflectivity and the complex refractive index in the second embodiment.

Although W is employed as the metal material included in the interconnection layer and the anti-reflection film in the above embodiment, it is not intended to be limitative. Mo, Ti, Al, or Cu can also lead to a similar effect. In addition, the values n, k of complex refractive index (n−i×k) for the WSiO film used as the anti-reflection film in the above-described second embodiment make it possible to suppress the reflectivity to 20% or lower if n=0.8 to 4.5 and k=0 to 2.0, as shown in FIG. 16.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming an interconnection layer consisting of a metal material on a substrate;

thereafter forming an insulating layer on said interconnection layer; and forming an anti-reflection film on said insulating layer, said anti-reflection film including a compound having metal-silicon-oxygen, using the same metal material as the material used for said interconnection layer;

forming a resist film having a pattern of a shape on said anti-reflection film by photolithography; and patterning said interconnection layer and said anti-reflection film according to the pattern of said resist film.

\* \* \* \* \*